US011464087B2

United States Patent
Seppänen et al.

(10) Patent No.: US 11,464,087 B2
(45) Date of Patent: Oct. 4, 2022

(54) INORGANIC TFEL DISPLAY ELEMENT AND MANUFACTURING

(71) Applicant: Lumineq Oy, Espoo (FI)

(72) Inventors: Heli Seppänen, Espoo (FI); Tommy Turkulainen, Espoo (FI); Kari Härkönen, Espoo (FI)

(73) Assignee: Lumineq Oy, Espoo (FI)

( * ) Notice: Subject to any disclaimer, the term of this patent is extended or adjusted under 35 U.S.C. 154(b) by 635 days.

(21) Appl. No.: 16/329,035

(22) PCT Filed: Aug. 30, 2017

(86) PCT No.: PCT/FI2017/050608
§ 371 (c)(1),
(2) Date: Feb. 27, 2019

(87) PCT Pub. No.: WO2018/042079
PCT Pub. Date: Mar. 8, 2018

(65) Prior Publication Data
US 2019/0223268 A1      Jul. 18, 2019

(30) Foreign Application Priority Data

Sep. 2, 2016    (FI) .................................... 20165652

(51) Int. Cl.
*H05B 33/22* (2006.01)
*H05B 33/14* (2006.01)
(Continued)

(52) U.S. Cl.
CPC ............ *H05B 33/145* (2013.01); *C09K 11/56* (2013.01); *C09K 11/574* (2013.01);
(Continued)

(58) Field of Classification Search
CPC ...... H05B 33/145; H05B 33/14; H05B 33/22; C09K 11/56; C09K 11/574; C23C 14/542;
(Continued)

(56) References Cited

U.S. PATENT DOCUMENTS

| 4,727,003 A | 2/1988 | Ohseto et al. |
| 5,026,661 A | 6/1991 | Migita et al. |

(Continued)

FOREIGN PATENT DOCUMENTS

| EP | 1 863 324 A1 | 12/2007 | |
| FI | 100758 B * | 2/1998 | ............. H05B 33/12 |

(Continued)

OTHER PUBLICATIONS

International Search Report for corresponding International Patent Application No. PCT/FI2017/050608 dated Dec. 21, 2017, 5 pages.

(Continued)

*Primary Examiner* — Henry Luong
(74) *Attorney, Agent, or Firm* — Merchant & Gould P.C.

(57) ABSTRACT

A method for manufacturing an inorganic thin film electroluminescent display element comprises forming a layer structure, said forming the layer structure comprising forming a first dielectric layer (11); forming a luminescent layer (12), comprising manganese doped zinc sulfide ZnS:Mn, on the first dielectric layer, and forming a second dielectric layer (13) on the luminescent layer. Each of the first and the second dielectric layers are formed so as to comprise nanolaminate with alternating aluminum oxide $Al_2O_3$ and zirconium oxide $ZrO_2$ sub-layers.

16 Claims, 3 Drawing Sheets

(not in scale)

(51) Int. Cl.
*C09K 11/57* (2006.01)
*C23C 16/30* (2006.01)
*C23C 16/40* (2006.01)
*C23C 16/455* (2006.01)
*C09K 11/56* (2006.01)
*C23C 18/12* (2006.01)
*C23C 14/54* (2006.01)

(52) U.S. Cl.
CPC .......... *C23C 14/542* (2013.01); *C23C 16/306* (2013.01); *C23C 16/403* (2013.01); *C23C 16/405* (2013.01); *C23C 16/45525* (2013.01); *C23C 16/45531* (2013.01); *C23C 18/1283* (2013.01); *H05B 33/14* (2013.01); *H05B 33/22* (2013.01)

(58) Field of Classification Search
CPC ... C23C 16/306; C23C 16/403; C23C 16/405; C23C 16/45525; C23C 16/45531; C23C 18/1283
See application file for complete search history.

(56) References Cited

U.S. PATENT DOCUMENTS

| | | | |
|---|---|---|---|
| 6,113,977 A | 9/2000 | Soininen et al. | |
| 6,207,302 B1* | 3/2001 | Sugiura | C23C 16/409 428/917 |
| 6,358,632 B1 | 3/2002 | Dickey et al. | |
| 8,288,241 B2* | 10/2012 | Hirota | H01L 21/02178 438/387 |
| 2002/0101153 A1 | 8/2002 | Kim et al. | |
| 2002/0103087 A1* | 8/2002 | Stauf | C23C 16/409 505/100 |
| 2003/0152804 A1 | 8/2003 | Miura et al. | |
| 2005/0064236 A1* | 3/2005 | Lim | H05B 33/145 428/690 |
| 2005/0142712 A1* | 6/2005 | Lim | H01L 21/02252 438/197 |
| 2006/0043410 A1 | 3/2006 | Iwasaki et al. | |
| 2007/0024189 A1 | 2/2007 | Yamamoto et al. | |
| 2007/0205428 A1* | 9/2007 | Katayama | C09K 11/574 257/103 |
| 2008/0233762 A1* | 9/2008 | Hong | H01L 21/0228 438/763 |
| 2016/0017184 A1* | 1/2016 | Moore | C09J 11/04 156/247 |

FOREIGN PATENT DOCUMENTS

| | | |
|---|---|---|
| JP | 2008-251321 A | 10/2008 |
| WO | WO 2004/021745 A1 | 3/2004 |
| WO | WO 2004/032576 A1 | 4/2004 |
| WO | WO 2007/099883 A1 | 9/2007 |
| WO | WO 2014/009601 A1 | 1/2014 |

OTHER PUBLICATIONS

Written Opinion of the International Searching Authority for corresponding International Patent Application No. PCT/FI2017/050608 dated Dec. 21, 2017, 7 pages.
Finnish Search Report for corresponding Finnish Patent Application No. 20165652 dated Mar. 31, 2017, 2 pages.
Yoshimasa, A., Electroluminescent Displays, Scientific Publishing Co., p. 16-17 (1995).
Extended European Search Report for corresponding European Patent Application No. 17845591.1 dated Feb. 6, 2020, 6 pages.

* cited by examiner

Fig. 2 (not in scale)

INORGANIC TFEL DISPLAY ELEMENT AND MANUFACTURING

This application is a National Stage Application of PCT/FI2017/050608, filed 30 Aug. 2017, which claims benefit of Application Serial No. 20165652, filed 2 Sep. 2016 in Finland and which applications are incorporated herein by reference. To the extent appropriate, a claim of priority is made to each of the above disclosed applications.

FIELD OF THE INVENTION

The present invention relates to electroluminescent displays, specifically to inorganic thin film electroluminescent displays.

BACKGROUND OF THE INVENTION

Electroluminescent displays (below also "EL display") have specific properties, such as durability and capacity of functioning at low temperatures, which make them as excellent display technology for the most challenging operating environments and conditions.

At a general level, the operation of EL displays is based on a luminescent material that emits light when exposed to an external electric field.

In inorganic EL displays provided as thin film structures, the luminescent material is arranged as a thin luminescent layer generally having a thickness of less than 1000 nanometers, typically approximately 500-750 nanometers. For low voltage applications, the thickness may be also lower. The luminescent layer is provided between two conductive electrode layers that are electrically insulated from the luminescent layer with thin dielectric layers serving for electrical insulating. A voltage difference between the electrodes provides an electric field, by the effect of which the electrons move in the luminescent layer and some of them excite, in the luminescent layer, so-called luminescent centers which are formed by the doping materials of the luminescent layer. Light is emitted as the excitation of the luminescent centers is relaxed.

The basic technology of EL displays is generally known and has been described extensively e.g. in "Electroluminescent Displays" (Yoshimasa A. Ono, World Scientific Publishing Co., 1995 (ISBN 981-02-1920-0) in Chapters 3, 5 and 8.

An EL display element is typically manufactured by forming the core operating layers, namely, the dielectric layers, the phosphor layer, and the electrode layers, on a glass substrate having a thickness in the range of 1 mm. For many applications, this is not practical. For example, in applications where an EL display panel is to be laminated within a glass panel for automotive windscreen, there is only a narrow gap which may have a thickness of some hundreds of micrometers only available for the entire stack of the EL display, including the glass substrate thereof.

Substrates with lower thickness are also required in applications where a completed EL display element is to be laminated on a curved, i.e. non-planar external substrate, and in other applications of flexible display structure.

Thus, there is a need for EL display elements with glass substrates having as low thickness as possible while ensuring sufficient rigidity of the EL element.

Unfortunately, the high process temperatures of current manufacturing processes of the commonly used EL display structures are close to the softening temperatures of the commonly used glass substrate materials, thereby preventing the use of sufficiently thin glass substrates to meet that need.

SUMMARY OF THE INVENTION

This summary is provided to introduce a selection of concepts in a simplified form that are further described below in the Detailed Description. This Summary is not intended to identify key features or essential features of the claimed subject matter, nor is it intended to be used to limit the scope of the claimed subject matter A method is disclosed which may be used for manufacturing an inorganic, possibly AC (alternating current) drivable, thin film electroluminescent display element which may be transparent. The method comprises forming a layer structure, said forming the layer structure comprising: forming a first dielectric layer, forming a luminescent layer, comprising manganese doped zinc sulfide ZnS:Mn, on the first dielectric layer, and forming a second dielectric layer on the luminescent layer.

Each of the first and the second dielectric layers are formed in the method so as to comprise nanolaminate material with alternating aluminum oxide $Al_2O_3$ and zirconium oxide $ZrO_2$ sub-layers. The luminescent layer may be formed by atomic layer deposition using maximum process temperature less than or equal to 250° C. Then, diethylzinc, hydrogen sulfide, and tris(2,2,6,6-tetramethyl-3,5-heptanedione)manganese (hereinafter referred to as "Mn(thd)3") may be used as precursors.

Many of the attendant features will be more readily appreciated as the same becomes better understood by reference to the following detailed description considered in connection with the accompanying drawings.

BRIEF DESCRIPTION OF THE DRAWINGS

The present description will be better understood from the following detailed description read in light of the accompanying drawings, wherein.

Figure 2:
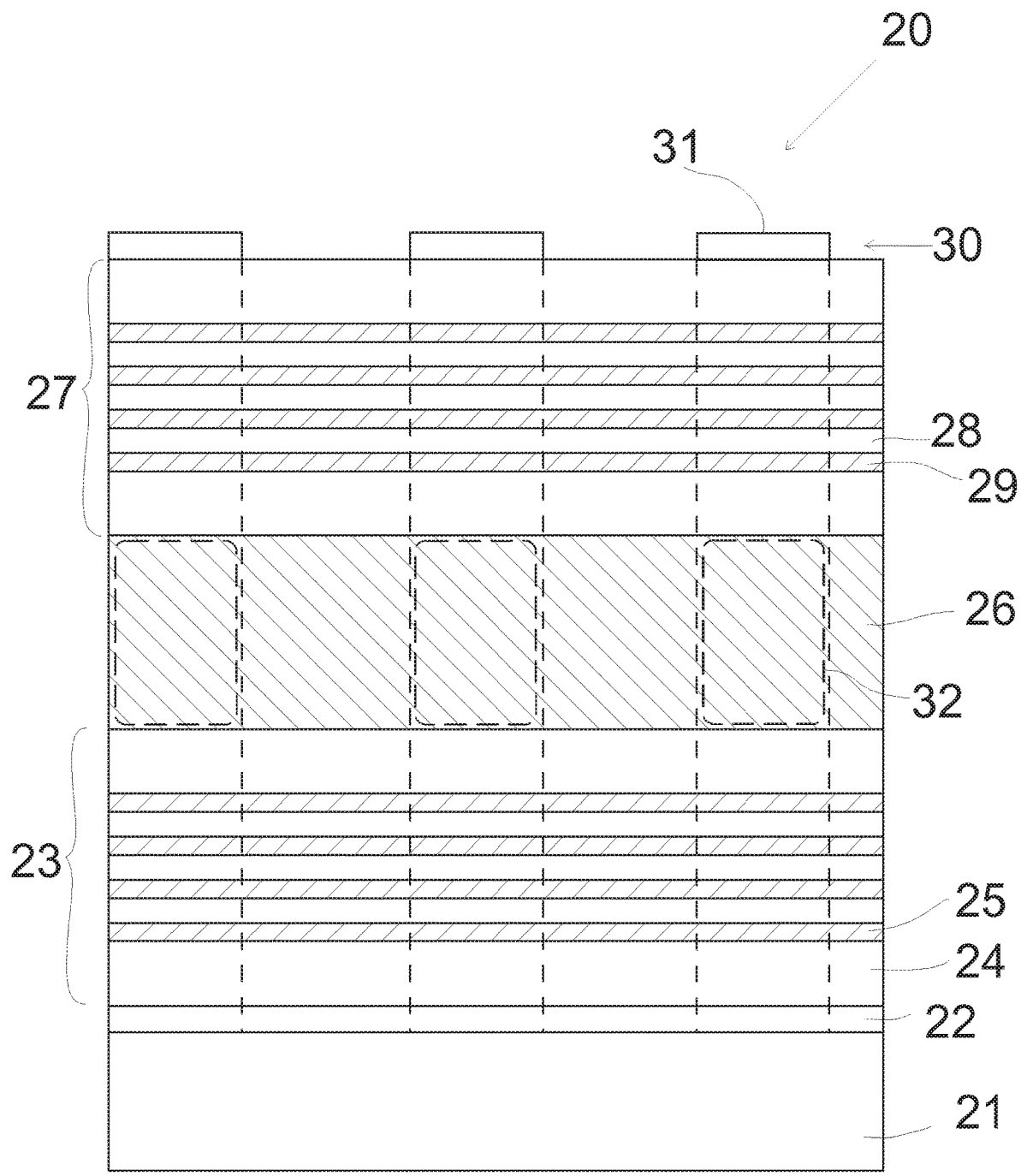
FIG. 2 illustrates an electroluminescent display element.

The drawing of FIG. 2 is not in scale.

DETAILED DESCRIPTION

Figure 1:
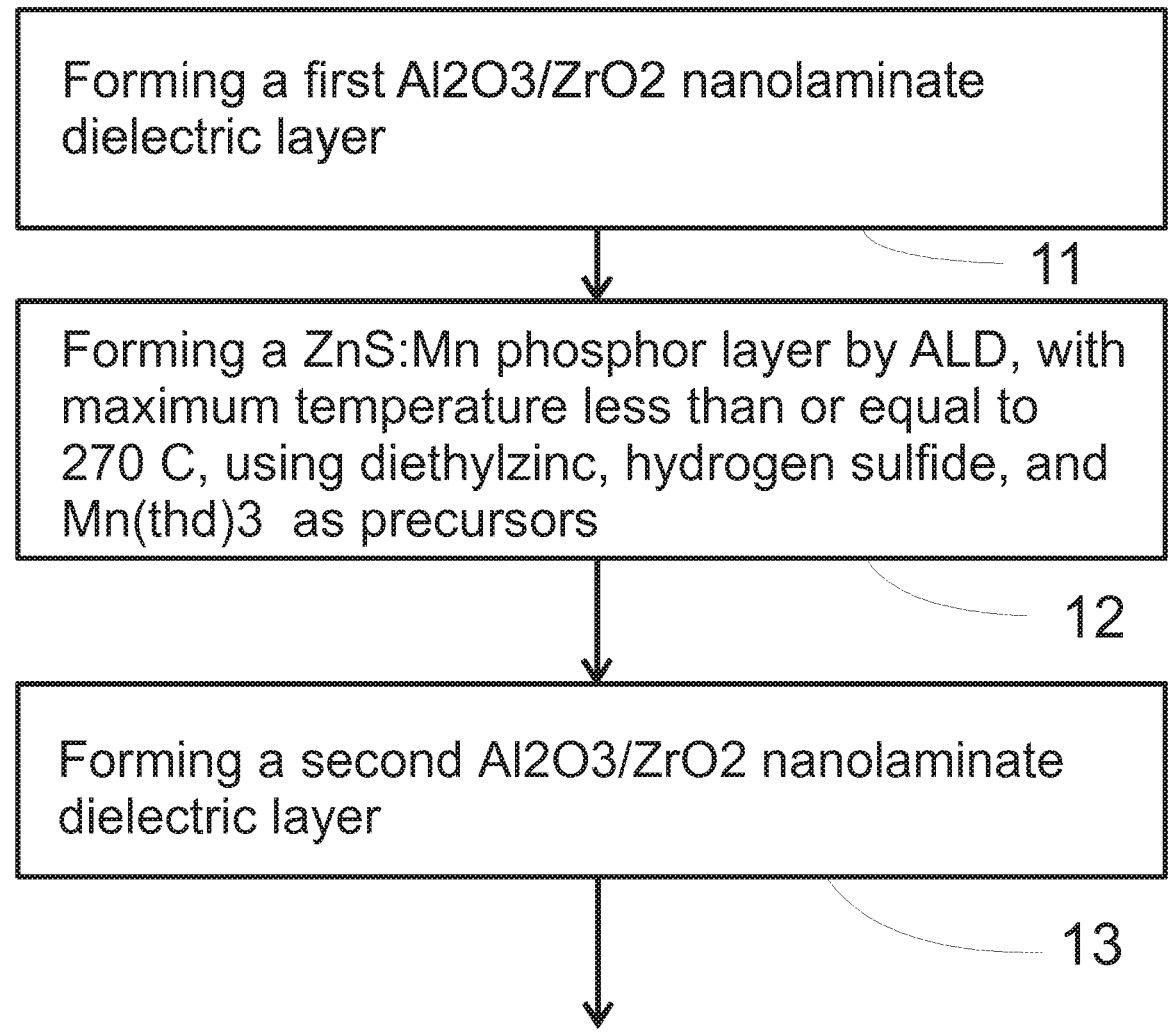
FIG. 1 illustrates a flow chart of a method for manufacturing an electroluminescent display element.

The method of FIG. 1 may be used for manufacturing an inorganic thin film electroluminescent display element.

Generally, a complete inorganic thin film electroluminescence/electroluminescent ("EL") display element manufactured utilizing the method may comprise a dielectric layer—luminescent layer—dielectric layer positioned between a first and a second conductive electrode layers. The entire layer stack is formed and lies on a transparent substrate formed of glass or some other suitable material. In operation, with suitable electric field provided in the luminescent layer by supplying a voltage difference between the conductive electrode layers, electrons are discharged into the luminescent layer, giving rise to light emission as luminescence centers excited by the electrons return to their ground state.

A "display element" refers to a structure for a display, which element can be a complete, operable, stand-alone display device. Alternatively, the "element" can refer to a modular or inseparably integrated element as a part of a larger display device or display unit. For example, in the case of a multi-pixel display, a display element can comprise one or more pixels.

"Inorganic" refers to inorganic type of materials of the display element.

"Thin film" refers to the total thickness of the operational thin film layers of the EL display element, i.e. the layer stack without the transparent substrate thereof being less than some tens of micrometres, for example, in the range of 1 to 10 µm. Typically, that thickness is less than or equal to 3 µm.

The method of FIG. 1 comprises, in operation 11, forming a first dielectric layer which comprises nanolaminate material with alternating aluminum oxide $Al_2O_3$ and zirconium oxide $ZrO_2$ sub-layers.

"Nanolaminate" refers to the thickness of the alternating sub-layers in nanometer scale, i.e. in a range of a few to some dozens of nanometers. Nanolaminate may comprise any appropriate number of pairs of two adjacent sub-layers of different materials.

One or more, possibly most or all $ZrO_2$ sub-layers may have, for example, a thickness in the range of 1 to 9 nanometers, preferably in the range of 3 to 7, or 4 to nm. With such thickness, $ZrO_2$ sub-layers may be formed with dense tetragonal (111) phase, i.e. "t-$ZrO_2$" phase of the zirconium crystal. Small crystal size may result high resistance over the $ZrO_2$ sub-layer, in turn resulting in low leakage current in the EL display element. Further, said crystal structure also produces high permittivity which is an advantageous feature in the dielectric layers.

One or more, possibly most or all $Al_2O_3$ sub-layers may have, for example, a thickness in the range of 1 to 15 nm, preferably in the range of 3 to 10, or 5 to 10 nm. $Al_2O_3$ sub-layers with such thicknesses serve for producing suitable stress to the $ZrO_2$ sub-layers so that they may stay in their t-$ZrO_2$ phase.

As the first and/or the last sub-layer of the dielectric layer, an $Al_2O_3$ sub-layer may be formed which has a higher thickness than the other $Al_2O_3$ sub-layers superposed between the $ZrO_2$ sub-layers.

Next, in operation 12, a luminescent layer comprising, possibly completely consisting of, manganese doped zinc sulfide ZnS:Mn is formed on the first dielectric layer by atomic layer deposition ALD with a maximum process temperature in the range of 150 to 270° C., preferably 200 to 270° C. or 225 to 260° C., for example 250° C., using diethylzinc DEZ, hydrogen sulfide $H_2S$, and Mn(thd)3 as precursors. Other possible Mn precursors are $Mn(C_5H_5)_2$ and its alkyl-, aryl- or carbonyl-substituted derivatives.

As discussed above, the "luminescent layer" serves as a core part of the completed electroluminescent display element, emitting light when exposed to suitable electric field. This layer and/or the light emitting material thereof may also be called "phosphor".

Depositing a further layer "on" a previous layer refers merely to deposition that layer after the previous layer. It does not necessitate deposition "directly" on the previous layer, but one or more intermediate layers may be formed therebetween. Correspondingly, a layer or a layer structure lying "on" another layer or element does not necessarily lie "directly" on that another layer or element. For example, a layer structure of dielectric layer luminescent layer—dielectric layer lying on a transparent substrate does not exclude the possibility of a conductive electrode layer lying between the substrate and said layer structure.

"Atomic layer deposition ALD" refers to a thin film technology enabling accurate and well controlled production of thin film coatings with nanometer-scaled thicknesses. ALD may also be called Atomic Layer Epitaxy ALE. In an ALD process, the substrate is alternately exposed to at least two precursors, one precursor at a time, to form on the substrate a coating by alternately repeating essentially self-limiting surface reactions between the surface of the substrate (on the later stages, naturally, the surface of the already formed coating layer on the substrate) and the precursors. As a result, the deposited material is "grown" on the substrate molecule layer by molecule layer.

In conventional ALD processes for depositing ZnS:Mn, maximum temperatures in the range of 500-530° C. are typically used. Some examples of depositing a ZnS:Mn luminescent layer in an EL display with ATO dielectric layers using diethylzinc DEZ, hydrogen sulfide H2S, and Mn(thd)3 as precursors is discussed in U.S. Pat. No. 6,113, 977 A. In those examples, process temperatures of 350 and 450° C. were used.

The inventors have now surprisingly found, in contrast to the established understanding in the art, that high quality and stable ZnS:Mn of an EL display element with $Al_2O_3/ZrO_2$ nanolaminate in the dielectric layers may be produced in as low temperatures as 270° C. and lower. Using such temperatures may provide great advantages in that the entire process of forming the dielectric layers and the luminescent layer may take place in temperatures, for example, not substantially exceeding 270° C. This enables forming the EL display element layers on very thin glass substrates having thicknesses, for example, in the range of 100-250 µm or even lower without the risk that the glass substrate would lose its rigidity in result of softening. The latter is of particular importance when taking into account that in typical manufacturing processes, the glass sheets are conveyed automatically and, to save floor space of the manufacture, the glasses are held and transferred vertically or almost vertically, e.g. at 80 degrees angle relative to horizon. Then, if the glass sheets become so thin that they start bending under their own weight, the conveying process becomes considerably more difficult. Further, in higher temperatures, the very thin sheets start to deform from a uniform and flat shape to an unwanted wrinkled or crumpled shape if they are not completely evenly supported, even when held horizontally, let alone in vertical or semi-vertical position.

Such thin substrates facilitate producing the entire EL display element so as to have total thickness clearly below that of the conventional EL displays. For example, this may enable manufacturing of EL display elements with a total thickness allowing laminating the EL display within a glass panel for automotive wind screen. A typical laminated wind screen assembly comprises a glass plate with a thickness of 2.5 mm, an interlayer of a binder, such as Polyvinyl butyral (PVB), and another glass plate of 2.5 mm. Typical standard thicknesses for the binder layer are 0.38 mm, 0.76 mm, and 1.14 mm. Such assemblies may be referred to, according to the overall thickness thereof, for example, as "5.38 laminated glass". With this kind of glass assembly, the transparent EL display shall have a thickness of less than 0.38/0.76/ 1.14 mm, taking into account that usually a binder layer of 10 µm or somewhat less is needed at least on one side of the EL display to attach the display to the assembly.

Further, with such low glass substrates, the EL display element may be formed so as to be flexible allowing, for example, laminating thereof on curved and/or flexible external substrates.

"Maximum temperature" of the ALD process refers to both the maximum temperature in the ALD reactor chamber as well as the maximum temperatures of the precursors and any carrier gases supplied therein. Thus, neither the temperature of the reactor chamber nor the temperature of any gas supplied therein may exceed the maximum temperature.

In operation 13, a second dielectric layer comprising nanolaminate material with alternating aluminum oxide $Al_2O_3$ and zirconium oxide $ZrO_2$ sub-layers is formed on the on the luminescent layer. The second dielectric layer may be formed similarly to the first dielectric layer discussed above.

Also the first and/or the second dielectric layers may be formed by atomic layer deposition ALD.

In FIG. 1, manufacturing of only the layer structure of the dielectric layers and the luminescent layer is illustrated. Complete manufacturing process may further comprise, for example, forming a first conductive electrode layer on the transparent substrate, and forming a second conductive electrode layer on the second dielectric layer.

The first and the second conductive electrode layers may be patterned to form rows and columns, whereby pixels are formed at the sites where the rows and the columns of the different electrode layers intersect. As a voltage is applied between such intersecting electrodes, electroluminescence appears in the phosphor layer at the relevant pixel. Apart from such matrix-type displays, also other display types can be designed and manufactured using TFEL technology. For example, instead of a regular array of pixels, the active areas, i.e. the light emitting areas of the display can be arranged to form e.g. 7-segment number displays or designs displaying discrete icons or symbols at predetermined locations.

The EL display element 20 of FIG. 2 may be manufactured generally in accordance with the method discussed above with reference to FIG. 1. What is stated about the details of the EL display manufactured by the method discussed above with reference to FIG. 1 applies, mutatis mutandis, also to the EL display element 20 of FIG. 2. The same applies vice versa.

The EL display element 20 comprises, and the layers thereof are formed on a glass substrate 21 which may have a thickness, for example, in the range of 100 to 250 μm. Most preferably, the thickness is less than or equal to 100 μm.

A first or lower conductive layer 22 is formed as adjacent conductor stripes on the glass substrate. A first or lower dielectric layer 23, comprising nanolaminate with alternating $Al_2O_3$ and $ZrO_2$ sub-layers 24, 25 lie on the glass substrate 21 and the first conductive electrode layer 22. The $ZrO_2$ and $Al_2O_3$ sub-layers may have thicknesses as discussed above with reference to FIG. 1. As the outermost sub-layers of the first dielectric layer, there are $Al_2O_3$ sub-layers which have thicknesses higher than those of the other. Those thicknesses may be, for example, in a range of 15 to 30 nm, whereas the rest of the $Al_2O_3$ sub-layers may have a thickness, for example, in a range of 5 to 15 nm. The total thickness of the first dielectric layer may be, for example, in a range of 100 to 300 nm.

A luminescent layer 26 formed of ZnS:Mn, deposited by ALD with maximum process temperature as discussed above with reference to FIG. 1, using DEZ, $H_2S$, and Mn(thd)3 as precursors, lies on the first dielectric layer. Other possible Mn precursors are $Mn(C_5H_5)_2$ and its alkyl-, aryl- or carbonyl-substituted derivatives. The luminescent layer may have thickness, for example, in a range of 400 to 1000 nm.

On the luminescent layer, there is a second dielectric layer 27 which may be substantially similar to the first dielectric layer, comprising nanolaminate with alternating $Al_2O_3$ and $ZrO_2$ sub-layers 28, 29.

On the second dielectric layer, i.e. on top of the structure illustrated in FIG. 2, there is a second conductive electrode layer 30 which may be substantially similar to the first dielectric layer, with the stripes 31 thereof however being directed perpendicular or otherwise at an angle relative to the conductor stripes of the first dielectric layer 22.

The display element 20 of FIG. 2 thus has a matrix electrode configuration. In other embodiments, segmented electrode configurations may be used.

In the matrix electrode configuration, light-emitting areas in the form of pixels 32 are formed in the luminescent layer 26 at positions where the conductor stripes of the first and the second conductive electrode layers intersect.

Any appropriate further layers and/or elements may be present in an EL display element in addition to those illustrated in FIG. 2.

In any embodiment of the method and the EL display element discussed above, zirconium content of the first and/or the second dielectric layer is preferably at least 10% by mass. This refers to the mass of the zirconium contained in a dielectric layer being at least 10% of the overall mass of that layer.

In first and/or second dielectric layer where the zirconium content is at least 10% by mass, aluminum content is preferably at least 5% by mass. This refers to the mass of the aluminum contained in such dielectric layer being at least 5% of the overall mass of that layer.

In any embodiment of the method and the EL display element discussed above, Zn to Mn ratio in the luminescent layer preferably lies in the range of 200:1 to 30:1, more preferably in the range of 100:1 to 50:1. It may be, for example, equal to 50:1.

The EL display element of FIG. 2 may provide various great advantages. First, as discussed above with reference to FIG. 1, the thin glass substrate serves for achieving a low overall thickness of the EL display component. This, in turn, enables having the overall EL display element as a flexible structure which may be further laminated or otherwise attached to a flexible and/or curved external substrate.

In addition, the EL display element in accordance with that of FIG. 2 has been found to have excellent aging and stability performance. This is discussed further below with reference to FIG. 3.

In FIG. 1, only operations of forming the dielectric-phosphor-dielectric stack are shown. Naturally, manufacturing an entire EL display element may comprise further operations, such as forming the conductive electrode layers and any appropriate additional layers, for example, for protective and/or passivating purposes. In such operations, principles and processes as such known in the art may be used. In the following, one example of a more complete manufacturing process, which is generally in accordance with that illustrated and discussed above with reference to FIG. 1, is discussed.

Example

The exemplary process starts by providing a cleaned glass substrate. The glass substrate may be formed of, for example, soda lime glass, borosilicate glass, or any other material with sufficient transparency. In some embodiments, substrates other than glass materials may be suitable, such as polymer substrates which may provide greater mechanical durability or flexibility than glass. Preferably, the glass substrate has a thickness of less than or equal to 250 μm, more preferably less than or equal to 100 μm.

Next, a first conductive, transparent electrode layer is formed on the cleaned glass substrate by sputtering or by using ALD. In the case of sputtering, the first conductive electrode layer may be formed of indium tin oxide ITO. In the case of ALD, suitable materials include, for example, aluminum doped zinc oxide AZO.

The transparent electrode layer is patterned in accordance with a predetermined segment or matrix configuration by utilizing any appropriate lithographic operations.

Next, a first dielectric layer is deposited in an ALD reactor chamber heated to a temperature of 250° C. Nanolaminate of $Al_2O_3/ZrO_2$ sub-layers is deposited by ALD using trimethylaluminum TMA, zirconium chloride $ZrCl_4$, and water $H_2O$ as precursors, with following source temperatures: TMA at room temperature, $ZrCl_4$ at 225° C., and $H_2O$ at 13° C. A total thickness of 145 nm is deposited, starting by depositing one $Al_2O_3$ sub-layer with a thickness of 15 nm. After this first sub-layer, seven 10 nm $Al_2O_3$/5 nm $ZrO_2$ sub-layer pairs are deposited. Finally, a last $Al_2O_3$ sub-layer with a thickness of 15 nm is deposited as the last sub-layer of the first dielectric layer.

A luminescent layer of ZnS:Mn with a thickness of 950 nm is deposited by ALD on the first dielectric layer, using diethylzinc DEZ, hydrogen sulfide $H_2S$, and Mn(thd)3 as precursors. The ALD reactor chamber where the deposition is carried out, which may be the same as, or different from, the reactor chamber used for deposition of the first dielectric layer and the second dielectric layer discussed below, is heated to 250° C., and the precursors are supplied at following source temperatures: DEZ and $H_2S$ at room temperature, and Mn(thd)3 at 140° C. The luminescent layer is deposited with zinc to manganese ratio of 50:1.

A second dielectric layer is deposited by ALD on the luminescent layer, substantially similarly to the deposition of the first dielectric layer.

It is also possible to deposit the main portions of the dielectric layers in a different reactor chamber than the luminescent layer but to deposit a last part of the first dielectric layer and a first part of the second dielectric layer in the reactor chamber used for depositing the luminescent layer.

A second conductive electrode layer is formed on the luminescent layer. If a transparent EL display element is to be manufactured, the second conductive electrode layer may be deposited similarly to the first conductive electrode layer. In the case of non-transparent EL display element, the second conductive electrode layer may be formed, for example, by sputtering some suitable metal such as aluminum. The transparent electrode layer is patterned in accordance with the predetermined segment or matrix configuration by utilizing any appropriate lithographic operations.

Figure 3:
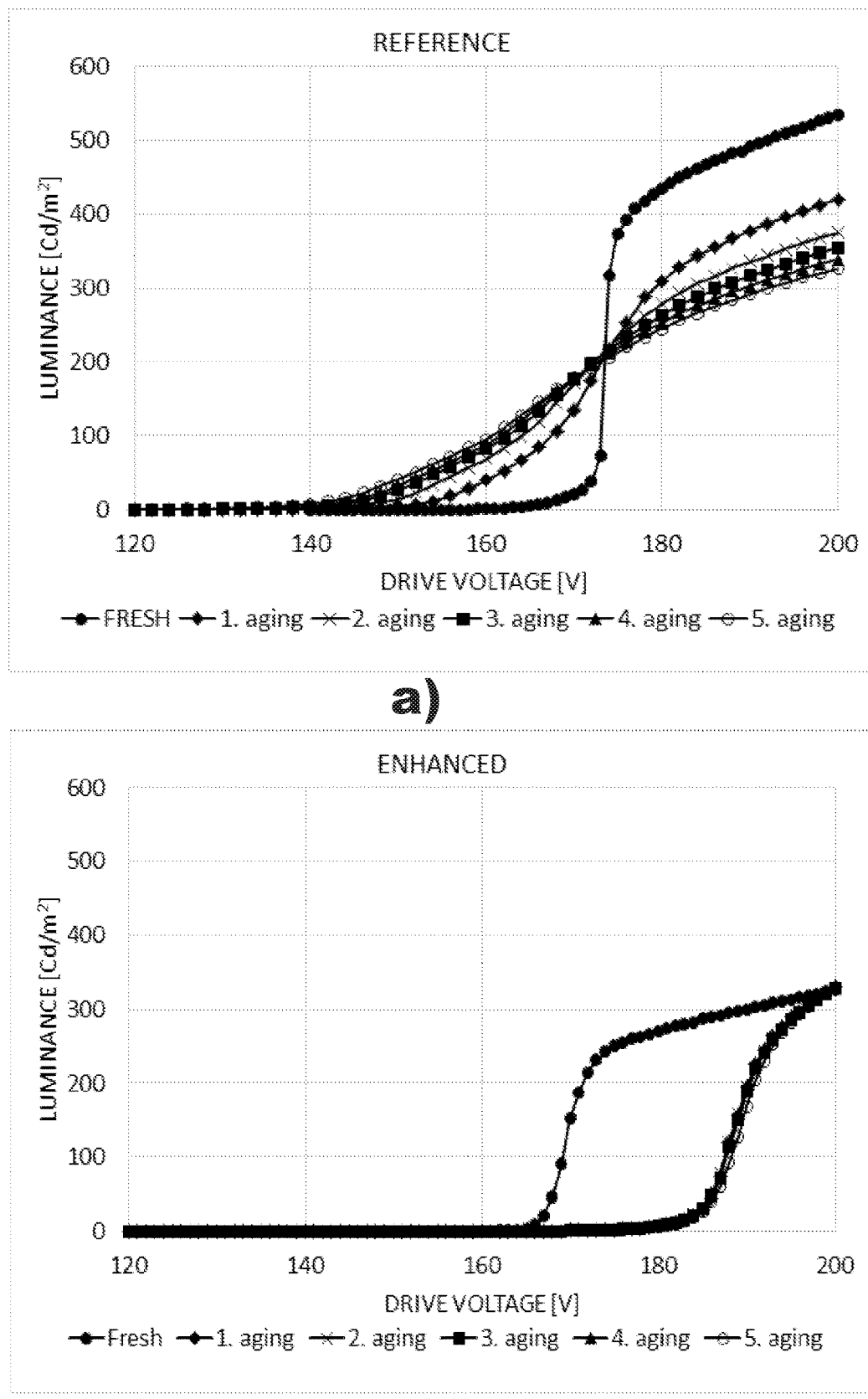
FIG. 3 shows test results of electroluminescent display elements.

In FIG. 3, test results of an EL display element manufactured in accordance with the above example are shown as compared with test results of a reference EL display element with ATO as the material of the dielectric layers, and the ZnS:Mn luminescent layer having been deposited by ALD at reactor chamber temperature of 525° C., using zinc chloride $ZnCl_2$, $H_2S$, and $MnCl_2$ as precursors. The EL display elements were manufactured with similar matrix configurations of the conductive electrode layers, with light emitting pixels formed at points of the matrix where conductors of the first and the second conductive electrode layers intersect.

The graphs of FIG. 3 show voltage-luminance curves measured for corresponding pixels of the tested EL display elements of fresh samples and after sequential aging steps. Each aging step was carried out by driving the samples by driving voltage of 134 V RMS (root mean square) with a frequency of 500 Hz for 23 hours. The voltage-luminance relationship was measured for both display elements after each aging step.

Graph (a) represents the results measured from the reference display element, and graph (b) represents the results measured from the El display element manufactured in accordance with the example process described above, hereinafter called "enhanced" EL display element.

As shown in graph (a), the high-voltage luminance, i.e. the luminance with the test pixel of the display element at "ON" state, decreases after each aging. Instead, as shown in graph (b), the ON-state luminance of the corresponding enhanced display element stabilizes already after the first aging step. Further, in the reference display element, in consequence of the aging steps, the voltage-luminance dependency changes from the initial, substantially abrupt curve with well-defined threshold voltage, into a gradually increasing luminance without any such clear threshold voltage. Instead, in the enhanced sample, the threshold voltage drifts from about 170 V to about 190 V in consequence of the first aging step, but stabilizes then substantially without the voltage-luminance curve becoming more gradual.

To summarize, FIG. 3 shows that the enhanced EL display element has excellent aging and stability performance. Enhanced stability results in reduced need for aging the displays in the manufacturing phase. Further, the stability of the voltage-luminance dependency may be greatly advantageous from the display element driving scheme points of view.

It is to be noted that the present invention is not limited to the embodiments and examples above. Instead, the embodiments of the present invention can freely vary within the scope of the claims.

It will be understood that the benefits and advantages described above may relate to one embodiment or example or may relate to several embodiments or examples. The embodiments and examples are not limited to those that solve any or all of the stated problems or those that have any or all of the stated benefits and advantages. It will further be understood that reference to 'an' item refers to one or more of those items.

The term "comprising" is used in this specification to mean including the feature(s) or act(s) followed thereafter, without excluding the presence of one or more additional features or acts.

The invention claimed is:

1. An inorganic thin film electroluminescent display element, comprising a layer structure comprising:
   a first dielectric layer,
   a luminescent layer, comprising manganese doped zinc sulfide ZnS:Mn, on the first dielectric layer, and
   a second dielectric layer on the luminescent layer,
   wherein each of the first and the second dielectric layers comprises nanolaminate with alternating aluminum oxide $Al_2O_3$ and zirconium oxide $ZrO_2$ sub-layers,
   wherein zirconium content of the first dielectric layer and/or the second dielectric layer is at least 10% by mass, and
   wherein, in the first dielectric layer and/or the second dielectric layer where the zirconium content is at least 10%, aluminum content is at least 5% by mass.

2. The inorganic thin film electroluminescent display element as defined in claim 1, wherein the luminescent layer is formed by atomic layer deposition using maximum process temperature in the range of 150 to 270° C.

3. The inorganic thin film electroluminescent display element as defined in claim 2, wherein the luminescent layer is formed using diethylzinc, hydrogen sulfide, and Mn(thd)3 as precursors.

4. The inorganic thin film electroluminescent display element as defined in claim 1, wherein the layer structure is formed on a glass substrate having a thickness of less than or equal to 250 μm.

5. The inorganic thin film electroluminescent display element as defined in claim 1, wherein a $ZrO_2$ sub-layer has a thickness in the range of 1 to 9 nm.

6. The inorganic thin film electroluminescent display element as defined in claim 1, wherein an $Al_2O_3$ sub-layer has a thickness in the range of 1 to 15 nm.

7. The inorganic thin film electroluminescent display element as defined in claim 1, wherein the electroluminescent display element is transparent.

8. The inorganic thin film electroluminescent display element as defined in claim 1, wherein the first and the second dielectric layers are formed by atomic layer deposition.

9. The inorganic thin film electroluminescent display element as defined in claim 1, wherein the luminescent layer is formed by atomic layer deposition using maximum process temperature in the range of 200 to 270° C.

10. The inorganic thin film electroluminescent display element as defined in claim 1, wherein the luminescent layer is formed by atomic layer deposition using maximum process temperature in the range of 225 to 260° C.

11. The inorganic thin film electroluminescent display element as defined in claim 1, wherein the luminescent layer is formed by atomic layer deposition using maximum process temperature is 250° C.

12. The inorganic thin film electroluminescent display element as defined in claim 1, wherein the layer structure is formed on a glass substrate having a thickness of less than or equal to 100 μm.

13. The inorganic thin film electroluminescent display element as defined in claim 1, wherein a $ZrO_2$ sub-layer has a thickness in the range of 3 to 7 nm.

14. The inorganic thin film electroluminescent display element as defined in claim 1, wherein a $ZrO_2$ sub-layer has a thickness in the range of 4 to 6 nm.

15. The inorganic thin film electroluminescent display element as defined in claim 1, wherein an $Al_2O_3$ sub-layer has a thickness in the range of 3 to 10 nm.

16. The inorganic thin film electroluminescent display element as defined in claim 1, wherein an $Al_2O_3$ sub-layer has a thickness in the range of 5 to 10 nm.

\* \* \* \* \*